(12) United States Patent
Liu

(10) Patent No.: US 10,510,990 B2
(45) Date of Patent: Dec. 17, 2019

(54) GROOVE STRUCTURE FOR PRINTING OLED DISPLAY AND MANUFACTURING METHOD FOR OLED DISPLAY

(71) Applicant: Shenzhen China Star Optoelectronics Technology Co., Ltd., Shenzhen (CN)

(72) Inventor: Yawei Liu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 295 days.

(21) Appl. No.: 15/508,105

(22) PCT Filed: Dec. 19, 2016

(86) PCT No.: PCT/CN2016/110736
§ 371 (c)(1),
(2) Date: Mar. 2, 2017

(87) PCT Pub. No.: WO2018/086194
PCT Pub. Date: May 17, 2018

(65) Prior Publication Data
US 2018/0241009 A1    Aug. 23, 2018

(30) Foreign Application Priority Data

Nov. 14, 2016   (CN) .......................... 2016 1 1009326

(51) Int. Cl.
*H01L 51/56*    (2006.01)
*H01L 51/52*    (2006.01)
(Continued)

(52) U.S. Cl.
CPC ............ *H01L 51/56* (2013.01); *H01L 51/001* (2013.01); *H01L 51/0004* (2013.01);
(Continued)

(58) Field of Classification Search
CPC . H01L 51/56; H01L 51/0021; H01L 51/0004; H01L 51/5209; H01L 51/001;
(Continued)

(56) References Cited

U.S. PATENT DOCUMENTS

| | | | |
|---|---|---|---|
| 7,294,856 B2* | 11/2007 | Ito | H01L 27/3246 257/13 |
| 9,929,342 B2* | 3/2018 | Dai | H01L 51/0005 |
| 2016/0285028 A1* | 9/2016 | Iguchi | H01L 51/5088 |

FOREIGN PATENT DOCUMENTS

CN            105470408 A      4/2016

* cited by examiner

*Primary Examiner* — Karen Kusumakar
(74) *Attorney, Agent, or Firm* — Leong C. Lei

(57) ABSTRACT

The invention provides a groove structure for printing OLED display and manufacturing method for OLED display. By dividing the causeway surrounding the groove into a first and a second branch causeway layers provided in stack, the inclining inner peripheral surface of groove formed by first branch causeway forms a contact angle ranging 10-45° with the HIL ink, and the inclining inner peripheral surface of groove formed by second branch causeway forms a contact angle ranging 30-60° with the HIL ink, the inclining inner peripheral surface of groove formed by second branch causeway forms a contact angle ranging 10-45° with HTL ink and EML ink to restrict the height of HIL climbing upwards so that the top surface of HIL is flat or has a slightly convex in the middle to prevent current leakage at the edge of HIL, and improve the OLED display quality.

13 Claims, 5 Drawing Sheets

(51) Int. Cl.
*H01L 51/00* (2006.01)
*H01L 51/50* (2006.01)

(52) U.S. Cl.
CPC ...... *H01L 51/0021* (2013.01); *H01L 51/5209* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 2251/308* (2013.01); *H01L 2251/558* (2013.01)

(58) Field of Classification Search
CPC ............. H01L 51/5056; H01L 51/5092; H01L 51/5072; H01L 51/5088; H01L 51/5012; H01L 2251/558; H01L 2251/308
See application file for complete search history.

GROOVE STRUCTURE FOR PRINTING OLED DISPLAY AND MANUFACTURING METHOD FOR OLED DISPLAY

BACKGROUND OF THE INVENTION

1. Field of the Invention

The present invention relates to the field of display, and in particular to a groove structure for printing organic light-emitting diode (OLED) display and manufacturing method for OLED display.

2. The Related Arts

The organic light-emitting diode (OLED) display has the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

In general, the structure of an OLED display comprises: a substrate, an anode, a cathode, and an organic functional layer sandwiched between the anode and the cathode. The organic functional layer generally comprises a hole injection layer (HIL), a hole transport functional layer (HTL), an emissive layer (EML), an electronic injection layer (EIL), and an electron transport functional layer (ETL). The light-emission principle of the OLED display is that the semiconductor material and the organic light-emitting material emit light through the carrier injection and compound driven by an electric field.

The OLED display is usually manufactured as follows: first, forming the anode on the substrate, followed by forming the functional layers and the cathode sequentially on the anode, wherein the anode and the cathode are made of indium-tin-oxide (ITO). The organic functional, i.e., HTL, EML and ETL, are usually manufactured by vacuum thermal evaporation and solution process.

The solution process is to process the required material, such as dividing into nano-scale small particles and dissolved in a corresponding solution to form the ink. Then, a coating facility is used to deposit the solution on the surface of the substrate and wait for the solvent to evaporate to form a thin film on the substrate surface. Specifically, the coating process can be one of the following: ink-jet printing, nozzle printing, roller printing, spin printing, and so on.

On the substrate using the printing, a groove is usually manufactured to confine the ink. After baking, the ink shrinks within the confinement of the groove to form a thin film. Refer to FIG. 1, a groove 120 is formed on the substrate 100 by a causeway 110 surrounding the circumference of the ITO anode 130. By depositing the ink inside the groove 120, the HIL 140, hole transport layer 150, EML 160 are formed. As shown in FIG. 2, since the hydrophilic properties of the different inks are different, the ink having higher hydrophilic property tends to climb higher on the inclined inner peripheral surface of the causeway 110. Usually, the conductivity of the lowermost HIL is the best among the organic functional layers. When the ink climbs higher in the lowermost HIL, a leakage will be caused at the edge of the HIL with thinner thin film places, resulting in the quality declination of the OLED display.

SUMMARY OF THE INVENTION

The object of the present invention is to provide a groove structure for printing OLED display, able to prevent leakage at the edge of HIL of OLED display and improve the quality of OLED display.

Another object of the present invention is to provide a manufacturing method of OLED display, able to prevent leakage at the edge of HIL of OLED display and improve the quality of OLED display.

To achieve the above object, the present invention provides a groove structure for printing OLED display, the groove is disposed on a substrate and comprises: a causeway, a groove surrounded and formed by the causeway, the causeway comprising: a first branch causeway layer, and a second branch causeway layer stacked on the first branch causeway layer;

an inclining inner peripheral surface of the groove formed by the first branch causeway layer forming a contact angle ranging from 10° to 45° with the HIL ink of the OLED, and an inclining inner peripheral surface of the groove formed by the second branch causeway layer forming a contact angle ranging from 30° to 60° with the HIL ink of the OLED, and an inclining inner peripheral surface of the groove formed by the second branch causeway layer forming a contact angle ranging from 10° to 45° with the HTL ink and the EML ink of the OLED.

According to a preferred embodiment of the present invention, the substrate is disposed with an anode, and the causeway forming the groove is disposed at the peripheral edge of the anode and on the substrate.

According to a preferred embodiment of the present invention, the height difference between an upper surface of the first branch causeway and the anode ranges from 50 nm to 800 nm, and the causeway has a thickness less than 3 μm.

According to a preferred embodiment of the present invention, the anode is made of indium-tin-oxide (ITO).

According to a preferred embodiment of the present invention, the angle between the inclining inner peripheral surface of the groove formed by the causeway and the substrate ranges from 30° to 60°, and the width of the groove gradually increases from bottom up.

The present invention also provides a manufacturing method for OLED display, which comprises the following steps of:

Step 1: providing a substrate, a material for first branch causeway layer material, and a material for branch causeway layer;

Step 2: forming an anode on the substrate, using the material for first branch causeway layer and a material for second branch causeway layer to sequentially manufacture a first branch causeway layer and a second branch causeway layer in a stack structure on the substrate by a printing, a drying process and an etching process, for forming a causeway disposed at the peripheral edge of the anode and on the substrate, the causeway surrounding to form a groove;

Step 3: providing an hole injection layer (HIL) ink, dripping the HIL ink into the groove, the HIL ink forming a contact angle ranging from 10° to 45° with an inclining inner peripheral surface of the groove formed by the first branch causeway layer, and the HIL ink forming a contact angle ranging from 30° to 60° with an inclining inner peripheral surface of the groove formed by the second branch causeway layer, baking dry to form an HIL;

Step 4: providing an hole transport layer (HTL) ink, dripping the HTL ink into the groove, the HTL ink forming a contact angle ranging from 10° to 45° with the inclining inner peripheral surface of the groove formed by the second branch causeway layer, baking dry to form an HTL stacked on the HIL;

Step 5: providing an emissive layer (EML) ink, dripping the EML ink into the groove, the EML ink forming a contact angle ranging from 10° to 45° with the inclining inner peripheral surface of the groove formed by the second branch causeway layer, baking dry to form an EML stacked on the HTL;

Step 6: forming an electron transport layer (ETL), an electron injection layer (EIL) and a cathode sequentially on the EML.

According to a preferred embodiment of the present invention, the anode is made of indium-tin-oxide (ITO).

According to a preferred embodiment of the present invention, in Step 2, the height difference between an upper surface of the first branch causeway and the anode ranges from 50 nm to 800 nm, and the causeway has a thickness less than 3 μm.

According to a preferred embodiment of the present invention, the process used for forming the ETL and EIL is a vacuum evaporation process.

According to a preferred embodiment of the present invention, in Step 2, the angle between the inclining inner peripheral surface of the groove formed by the causeway and the substrate ranges from 30° to 60°, and the width of the groove gradually increases from bottom up.

The present invention also provides a manufacturing method for OLED display, which comprises the following steps of:

Step 1: providing a substrate, a material for first branch causeway layer material, and a material for branch causeway layer;

Step 2: forming an anode on the substrate, using the material for first branch causeway layer and a material for second branch causeway layer to sequentially manufacture a first branch causeway layer and a second branch causeway layer in a stack structure on the substrate by a printing, a drying process and an etching process, for forming a causeway disposed at the peripheral edge of the anode and on the substrate, the causeway surrounding to form a groove;

Step 3: providing an hole injection layer (HIL) ink, dripping the HIL ink into the groove, the HIL ink forming a contact angle ranging from 10° to 45° with an inclining inner peripheral surface of the groove formed by the first branch causeway layer, and the HIL ink forming a contact angle ranging from 30° to 60° with an inclining inner peripheral surface of the groove formed by the second branch causeway layer, baking dry to form an HIL;

Step 4: providing an hole transport layer (HTL) ink, dripping the HTL ink into the groove, the HTL ink forming a contact angle ranging from 10° to 45° with the inclining inner peripheral surface of the groove formed by the second branch causeway layer, baking dry to form an HTL stacked on the HIL;

Step 5: providing an emissive layer (EML) ink, dripping the EML ink into the groove, the EML ink forming a contact angle ranging from 10° to 45° with the inclining inner peripheral surface of the groove formed by the second branch causeway layer, baking dry to form an EML stacked on the HTL;

Step 6: forming an electron transport layer (ETL), an electron injection layer (EIL) and a cathode sequentially on the EML;

wherein the anode being made of indium-tin-oxide (ITO);
wherein the process used for forming the ETL and EIL being a vacuum evaporation process.

Compared to the known techniques, the present invention provides the following advantages: the present invention provides a groove structure for printing OLED display. By dividing the causeway surrounding the groove into a first branch causeway layer and a second branch causeway layer provided in stack, the inclining inner peripheral surface of the groove formed by the first branch causeway forms a contact angle ranging 10° to 45° with the HIL ink, and the inclining inner peripheral surface of the groove formed by the second branch causeway forms a contact angle ranging 30° to 60° with the HIL ink, the inclining inner peripheral surface of the groove formed by the second branch causeway forms a contact angle ranging 10° to 45° with the HTL ink and the EML ink so as to restrict the height of the HIL climbing upwards the surrounding so that the top surface of the formed HIL is flat or has a slightly convex in the middle to prevent the current leakage at the edge of the HIL, and improve the quality of the OLED display. The invention present also provides a manufacturing method for OLED display, able to prevent the current leakage at the edge of the HIL, and improve the quality of the OLED display.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
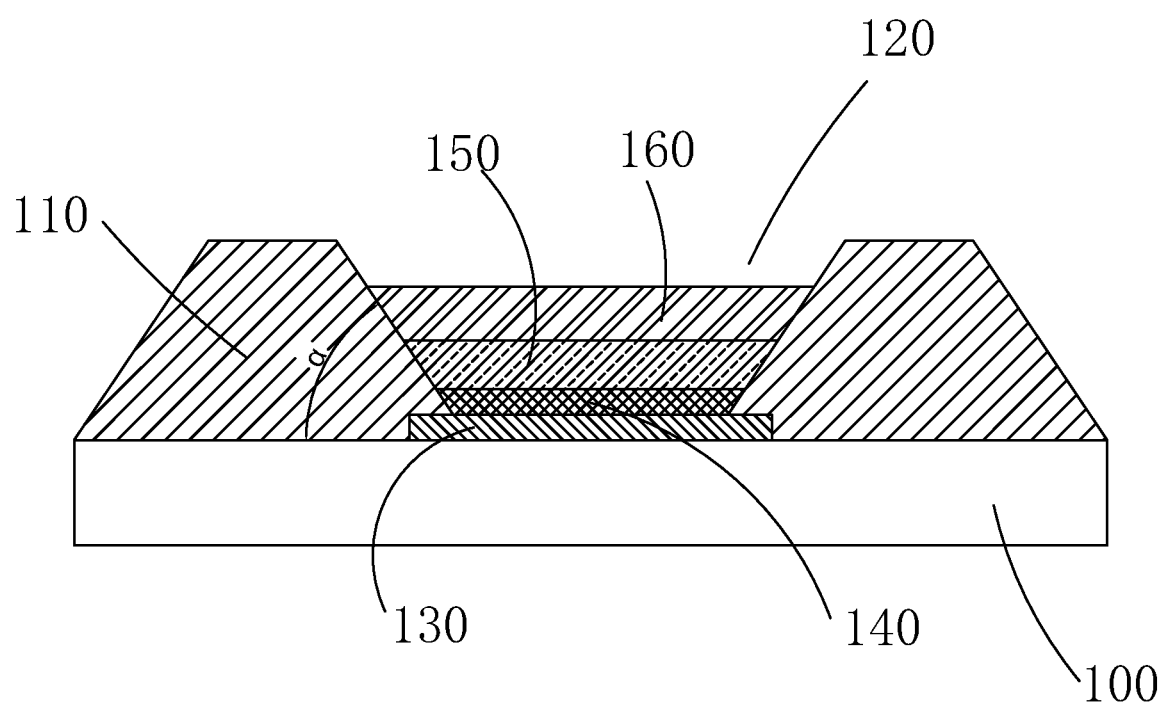
FIG. 1 is a schematic view showing a known groove structure for printing of organic functional layers of OLED display.
Figure 2:
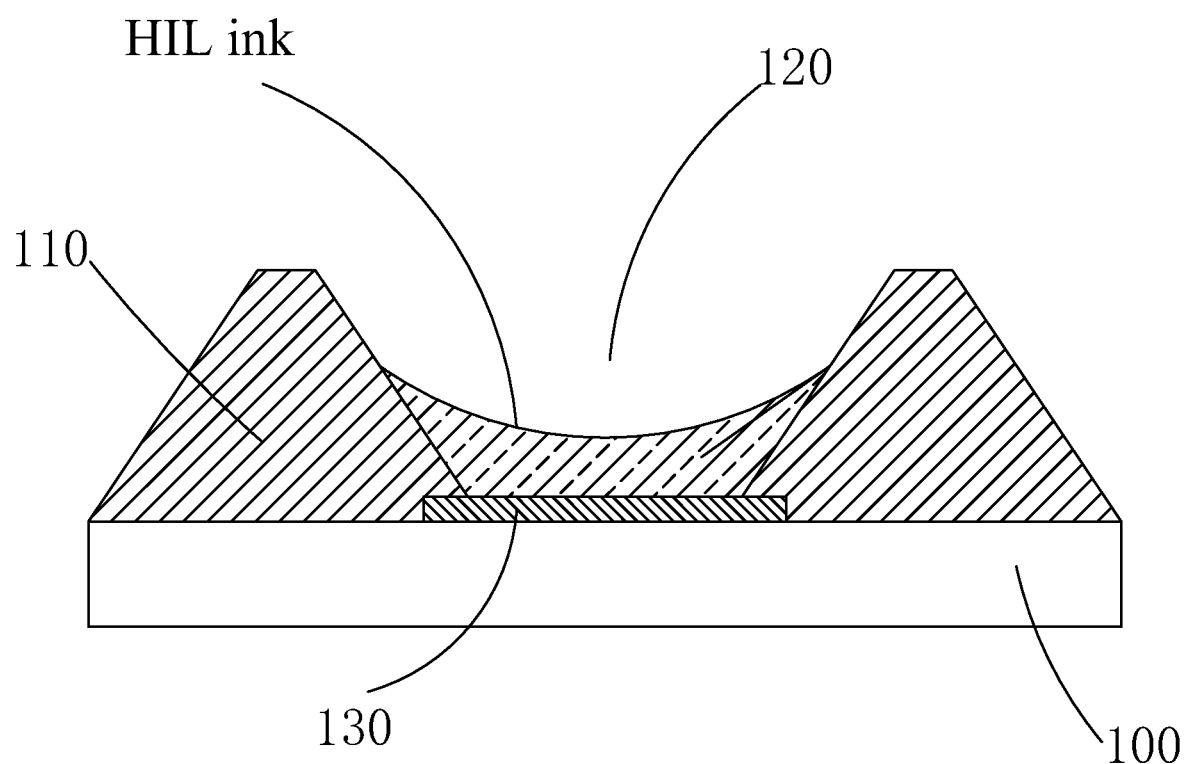
FIG. 2 is a schematic view showing the relation between the groove and the HIL ink in the conventional printing when the HIL ink climbing to high on the inclining inner peripheral surface of the causeway surrounding the groove.
Figure 3:
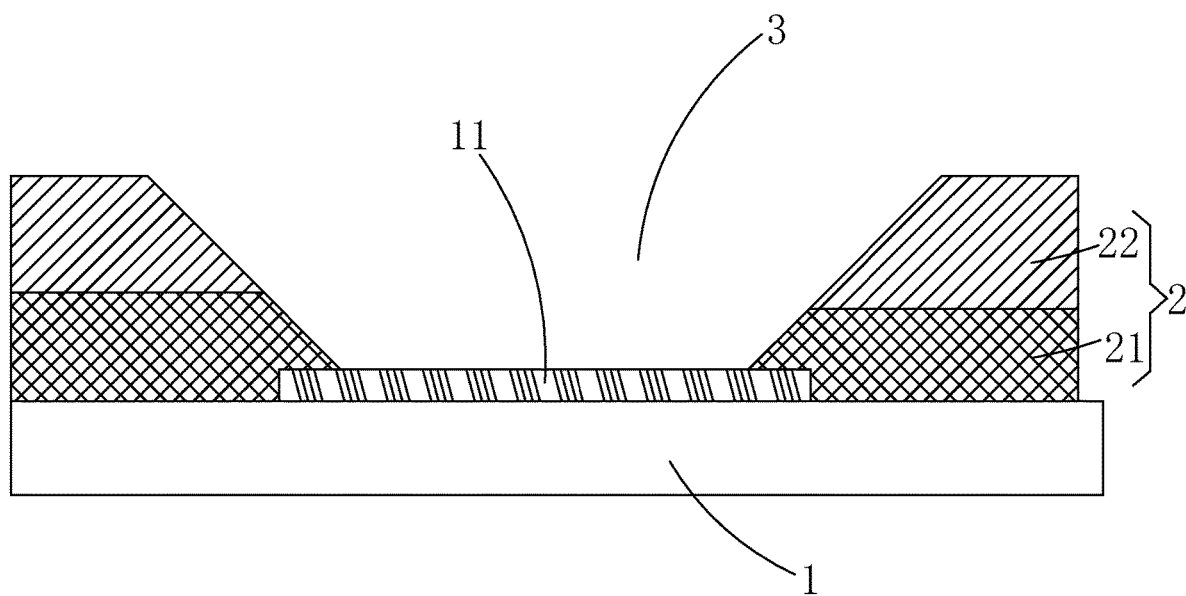
FIG. 3 is a schematic view showing the groove structure for printing OLED display and Step 2 of the manufacturing method for OLED display provided by an embodiment of the present invention.

Refer to FIG. 3. The present invention provides a groove structure for printing OLED display, the groove is disposed on a substrate 1 and comprises: a causeway 2, a groove 3 surrounded and formed by the causeway 2.

The causeway 2 comprises: a first branch causeway layer 21, and a second branch causeway layer 22 stacked on the first branch causeway layer 21.

An inclining inner peripheral surface of the groove 3 formed by the first branch causeway layer 21 forms a contact angle ranging from 10° to 45° with the HIL ink of the OLED, and an inclining inner peripheral surface of the groove 3 formed by the second branch causeway layer 22 forms a contact angle ranging from 30° to 60° with the HIL ink of the OLED, and an inclining inner peripheral surface of the groove 3 formed by the second branch causeway layer 22 forms a contact angle ranging from 10° to 45° with the HTL ink and the EML ink of the OLED.

Specifically, the substrate 1 is disposed with an anode 11, and the causeway 2 forming the groove 3 is disposed at the peripheral edge of the anode 11 and on the substrate 1. Preferably, the anode is made of indium-tin-oxide (ITO). The substrate 1 is a transparent substrate, and preferably, a glass substrate.

Specifically, the height difference between an upper surface of the first branch causeway 21 and the anode 11 ranges from 50 nm to 800 nm, and the causeway 2 has a thickness less than 3 μm.

Specifically, the angle between the inclining inner peripheral surface of the groove 3 formed by the causeway 2 and the substrate 1 ranges from 30° to 60°, and the width of the groove 3 gradually increases from bottom up.

It should be noted that the function of the groove structure is to restrict the flowing of the ink so that the ink is accommodated inside the groove. After baking dry, the ink is shrunk inside the confinement formed by the groove structure and forms a thin film so as to accomplish the printing. In manufacturing the OLED display, the HIL, the HTL, and the EML are formed sequentially from the bottom up, wherein the HIL is most conductive and has a highest demand on the flatness. The present divides the causeway 2 forming the groove 3 into a stack of the first and the second branch causeway layers 21, 22, wherein the first branch causeway layer 21 is hydrophobic with HIL ink so that the specifically, the inclining inner peripheral surface of the groove 3 formed by the first branch causeway layer 21 forms a contact angle ranging from 10° to 45° with the HIL ink of the OLED, the second branch causeway layer 22 is weakly hydrophobic with HIL ink so that specifically, the inclining inner peripheral surface of the groove 3 formed by the second branch causeway layer 22 forms a contact angle ranging from 30° to 60° with the HIL ink. As such, the HIL thin film obtained by printing has a top surface that is flat or has a convex at the middle. Also, the second branch causeway 22 is hydrophilic with the EML ink so that specifically, the inclining inner peripheral surface of the groove 3 formed by the second branch causeway layer 22 forms a contact angle ranging from 10° to 45° with the HTL ink and the EML ink of the OLED. As such, the HTL thin film and the EML thin film obtained by printing have a top surface that has a concave at the middle, to prevent the HIL ink from climbing to high on the inclining inner peripheral surface contacting the groove 3 to avoid current leakage at the HIL edge and improve OLED display quality.

It should be noted that, by selecting different materials for manufacturing the first branch causeway layer 21 and the second branch causeway layer 22, the contact angles formed between the first branch causeway layer 21 and the second branch causeway layer 22 and the corresponding inks can meet the requirements of the present invention.

Figure 5:
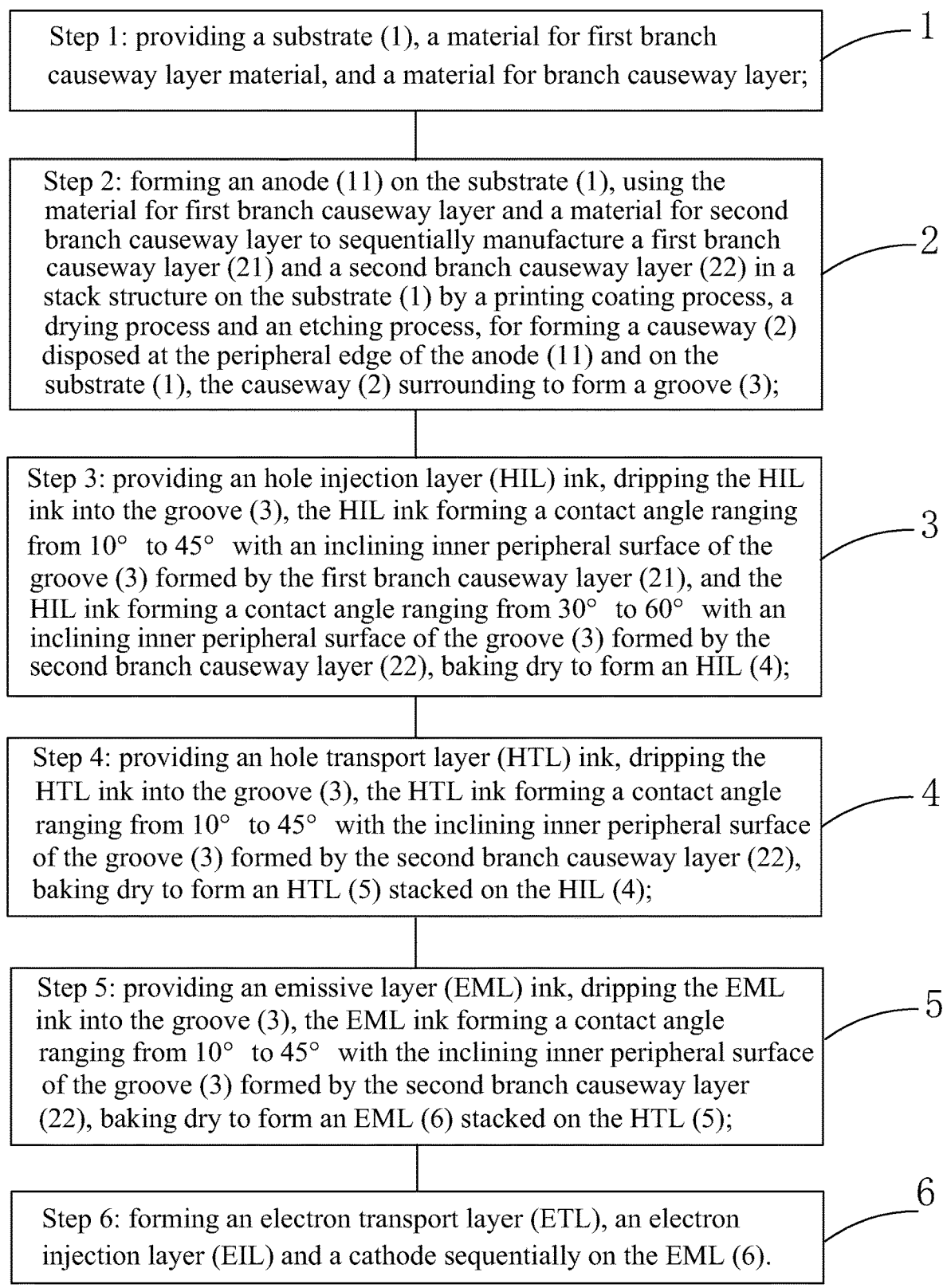
FIG. 5 is a schematic view a flowchart of the manufacturing method of OLED display provided by an embodiment of the present invention.

Referring to FIG. 5, based on the above groove structure, the present invention provides a manufacturing method for OLED display, which comprises the following steps:

Step 1: providing a substrate 1, a material for first branch causeway layer material, and a material for branch causeway layer.

Specifically, the substrate 1 is a transparent substrate, and preferably, a glass substrate. The material for first branch causeway layer material and the material for branch causeway layer have different hydrophobic/hydrophilic properties.

Step 2: referring to FIG. 3, forming an anode 11 on the substrate 1, using the material for first branch causeway layer and a material for second branch causeway layer to sequentially manufacture a first branch causeway layer 21 and a second branch causeway layer 22 in a stack structure on the substrate 1 by a printing, a drying process and an etching process, for form a causeway 2 disposed at the peripheral edge of the anode 11 and on the substrate 1, the causeway 2 surrounding to form a groove 3.

Preferably, the anode 11 is made of indium-tin-oxide (ITO). The angle between the inclining inner peripheral surface of the groove 3 formed by the causeway 2 and the substrate 1 ranges from 30° to 60°, and the width of the groove 3 gradually increases from bottom up.

Figure 4:
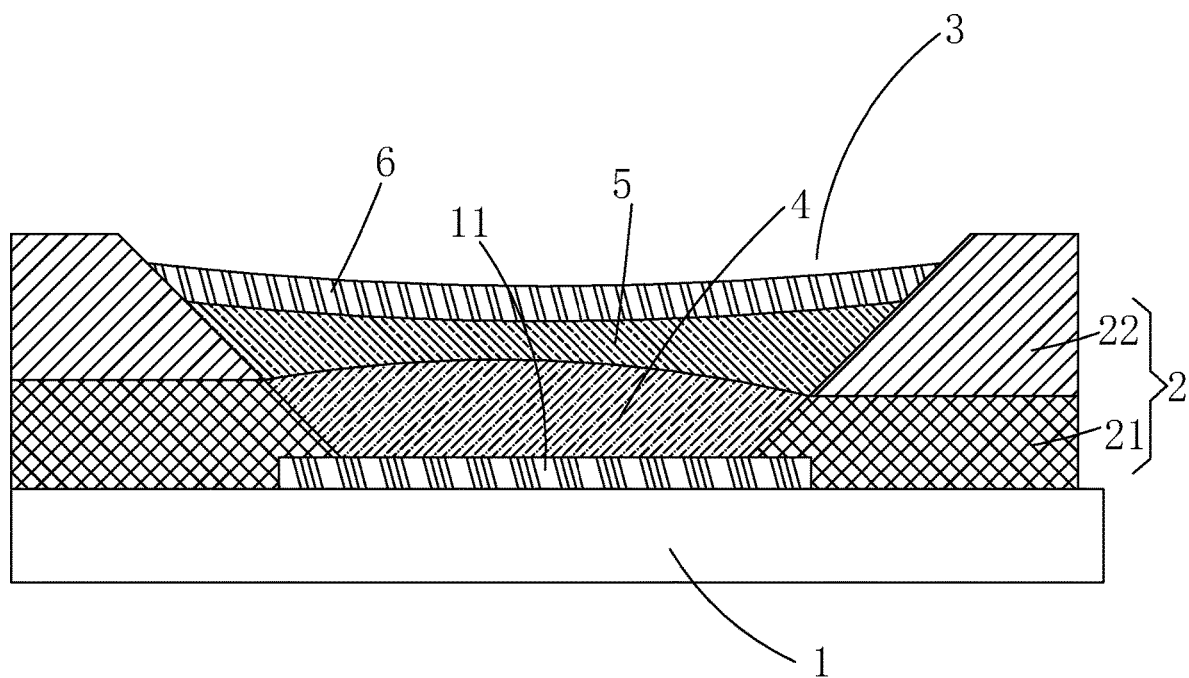
FIG. 4 is a schematic view showing Steps 3-5 of the manufacturing method for OLED display provided by an embodiment of the present invention.

Step 3: referring to FIG. 4, providing an hole injection layer (HIL) ink, dripping the HIL ink into the groove 3, the HIL ink forming a contact angle ranging from 10° to 45° with an inclining inner peripheral surface of the groove 3 formed by the first branch causeway layer 21, and the HIL ink forming a contact angle ranging from 30° to 60° with an inclining inner peripheral surface of the groove 3 formed by the second branch causeway layer 22, baking dry to form an HIL 4.

Specifically, by controlling the formed contact angle between the HIL and the causeway 2, the HIL 4 obtained by the printing has a top surface that is flatter or has a convex at the middle. Preferably, the e HIL ink forming a contact angle ranging from 30° to 60° with an inclining inner peripheral surface of the groove 3 formed by the first branch causeway layer 21 so that the subsequently formed HIL 4 has a flat top surface.

Step 4: referring to FIG. 4, providing an hole transport layer (HTL) ink, dripping the HTL ink into the groove 3, the HTL ink forming a contact angle ranging from 10° to 45° with the inclining inner peripheral surface of the groove 3 formed by the second branch causeway layer 22, baking dry to form an HTL 5 stacked on the HIL 4.

Specifically, by controlling the formed contact angle between the HTL 5 and the causeway 2, the HTL 5 obtained by the printing has a top surface that has a concave at the middle.

Step 5: referring to FIG. 4, providing an emissive layer (EML) ink, dripping the EML ink into the groove 3, the EML ink forming a contact angle ranging from 10° to 45° with the inclining inner peripheral surface of the groove 3 formed by the second branch causeway layer 22, baking dry to form an EML 6 stacked on the HTL 5.

Specifically, by controlling the formed contact angle between the EML 6 and the causeway 2, the EML 6 obtained by the printing has a top surface that has a concave at the middle. In combination with the shape of the HIL 4 and HTL 5, the current leakage at the HIL4 edge can be prevented.

Step 6: forming an electron transport layer (ETL) (not shown), an electron injection layer (EIL) (not shown) and a cathode (not shown) sequentially on the EML 6.

Specifically, the process used for forming the ETL and EIL is a vacuum evaporation process. Preferably, the cathode is also made of ITO.

In summary, the present invention provides a groove structure for printing OLED display. By dividing the causeway surrounding the groove into a first branch causeway layer and a second branch causeway layer provided in stack, the inclining inner peripheral surface of the groove formed by the first branch causeway forms a contact angle ranging 10° to 45° with the HIL ink, and the inclining inner peripheral surface of the groove formed by the second branch causeway forms a contact angle ranging 30° to 60° with the HIL ink, the inclining inner peripheral surface of the groove formed by the second branch causeway forms a contact angle ranging 10° to 45° with the HTL ink and the EML ink so as to restrict the height of the HIL climbing upwards the surrounding so that the top surface of the formed HIL is flat or has a slightly convex in the middle to prevent the current leakage at the edge of the HIL, and improve the quality of the OLED display. The invention present also provides a manufacturing method for OLED display, able to prevent the current leakage at the edge of the HIL, and improve the quality of the OLED display.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A groove structure for printing OLED display, the groove is disposed on a substrate and comprises: a causeway, a groove surrounded and formed by the causeway;
    the causeway comprising: a first branch causeway layer, and a second branch causeway layer stacked on the first branch causeway layer;
    an inclining inner peripheral surface of the groove formed by the first branch causeway layer forming a contact angle ranging from 10° to 45° with the HIL ink of the OLED, and an inclining inner peripheral surface of the groove formed by the second branch causeway layer forming a contact angle ranging from 30° to 60° with the HIL ink of the OLED, and an inclining inner peripheral surface of the groove formed by the second branch causeway layer forming a contact angle ranging from 10° to 45° with the HTL ink and the EML ink of the OLED.

2. The groove structure for printing OLED display as claimed in claim 1, wherein the substrate is disposed with an anode, and the causeway forming the groove is disposed at the peripheral edge of the anode and on the substrate.

3. The groove structure for printing OLED display as claimed in claim 2, wherein the height difference between an upper surface of the first branch causeway and the anode ranges from 50 nm to 800 nm, and the causeway has a thickness less than 3 μm.

4. The groove structure for printing OLED display as claimed in claim 2, wherein the anode is made of indium-tin-oxide (ITO).

5. The groove structure for printing OLED display as claimed in claim 1, wherein the angle between the inclining inner peripheral surface of the groove formed by the causeway and the substrate ranges from 30° to 60°, and the width of the groove gradually increases from bottom up.

6. A manufacturing method for OLED display, which comprises the following steps of:
    Step 1: providing a substrate, a material for first branch causeway layer material, and a material for branch causeway layer;
    Step 2: forming an anode on the substrate, using the material for first branch causeway layer and a material for second branch causeway layer to sequentially manufacture a first branch causeway layer and a second branch causeway layer in a stack structure on the substrate by a printing, a drying process and an etching process, for forming a causeway disposed at the peripheral edge of the anode and on the substrate, the causeway surrounding to form a groove;
    Step 3: providing an hole injection layer (HIL) ink, dripping the HIL ink into the groove, the HIL ink forming a contact angle ranging from 10° to 45° with an inclining inner peripheral surface of the groove formed by the first branch causeway layer, and the HIL ink forming a contact angle ranging from 30° to 60° with an inclining inner peripheral surface of the groove formed by the second branch causeway layer, baking dry to form an HIL;
    Step 4: providing an hole transport layer (HTL) ink, dripping the HTL ink into the groove, the HTL ink forming a contact angle ranging from 10° to 45° with the inclining inner peripheral surface of the groove formed by the second branch causeway layer, baking dry to form an HTL stacked on the HIL;
    Step 5: providing an emissive layer (EML) ink, dripping the EML ink into the groove, the EML ink forming a contact angle ranging from 10° to 45° with the inclining inner peripheral surface of the groove formed by the second branch causeway layer, baking dry to form an EML stacked on the HTL;
    Step 6: forming an electron transport layer (ETL), an electron injection layer (EIL) and a cathode sequentially on the EML.

7. The manufacturing method of OLED display as claimed in claim 6, wherein the anode is made of indium-tin-oxide (ITO).

8. The manufacturing method of OLED display as claimed in claim 6, wherein the height difference between an upper surface of the first branch causeway and the anode ranges from 50 nm to 800 nm, and the causeway has a thickness less than 3 μm.

9. The manufacturing method of OLED display as claimed in claim 6, wherein the process used for forming the electron transport layer (ETL) and electron injection layer (EIL) is a vacuum evaporation process.

10. The manufacturing method of OLED display as claimed in claim 6, wherein the angle between the inclining inner peripheral surface of the groove formed by the causeway and the substrate ranges from 30° to 60°, and the width of the groove gradually increases from bottom up.

11. A manufacturing method for OLED display, which comprises the following steps of:
    Step 1: providing a substrate, a material for first branch causeway layer material, and a material for branch causeway layer;
    Step 2: forming an anode on the substrate, using the material for first branch causeway layer and a material for second branch causeway layer to sequentially manufacture a first branch causeway layer and a second branch causeway layer in a stack structure on the substrate by a printing, a drying process and an etching process, for forming a causeway disposed at the peripheral edge of the anode and on the substrate, the causeway surrounding to form a groove;

Step 3: providing an hole injection layer (HIL) ink, dripping the HIL ink into the groove, the HIL ink forming a contact angle ranging from 10° to 45° with an inclining inner peripheral surface of the groove formed by the first branch causeway layer, and the HIL ink forming a contact angle ranging from 30° to 60° with an inclining inner peripheral surface of the groove formed by the second branch causeway layer, baking dry to form an HIL;

Step 4: providing an hole transport layer (HTL) ink, dripping the HTL ink into the groove, the HTL ink forming a contact angle ranging from 10° to 45° with the inclining inner peripheral surface of the groove formed by the second branch causeway layer, baking dry to form an HTL stacked on the HIL;

Step 5: providing an emissive layer (EML) ink, dripping the EML ink into the groove, the EML ink forming a contact angle ranging from 10° to 45° with the inclining inner peripheral surface of the groove formed by the second branch causeway layer, baking dry to form an EML stacked on the HTL;

Step 6: forming an electron transport layer (ETL), an electron injection layer (EIL) and a cathode sequentially on the EML;

wherein the anode being made of indium-tin-oxide (ITO);

wherein the process used for forming the electron transport layer (ETL) and electron injection layer (EIL) being a vacuum evaporation process.

12. The manufacturing method of OLED display as claimed in claim 11, wherein the height difference between an upper surface of the first branch causeway and the anode ranges from 50 nm to 800 nm, and the causeway has a thickness less than 3 μm.

13. The manufacturing method of OLED display as claimed in claim 11, wherein the angle between the inclining inner peripheral surface of the groove formed by the causeway and the substrate ranges from 30° to 60°, and the width of the groove gradually increases from bottom up.

* * * * *